US009136347B2

(12) United States Patent
Park et al.

(10) Patent No.: US 9,136,347 B2
(45) Date of Patent: Sep. 15, 2015

(54) NITRIDE SEMICONDUCTOR DEVICE

(71) Applicant: Electronics and Telecommunications Research Institute, Daejeon (KR)

(72) Inventors: Young Rak Park, Daejeon (KR); Sang Choon Ko, Daejeon (KR); Woojin Chang, Daejeon (KR); Jae Kyoung Mun, Daejeon (KR); Sung-Bum Bae, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/311,675

(22) Filed: Jun. 23, 2014

(65) Prior Publication Data

US 2015/0187886 A1    Jul. 2, 2015

(30) Foreign Application Priority Data

Dec. 30, 2013 (KR) .................. 10-2013-0166513

(51) Int. Cl.
*H01L 29/66* (2006.01)
*H01L 29/20* (2006.01)
*H01L 29/205* (2006.01)
(Continued)

(52) U.S. Cl.
CPC ...... *H01L 29/66462* (2013.01); *H01L 29/2003* (2013.01); *H01L 29/205* (2013.01); *H01L 29/41725* (2013.01); *H01L 29/49* (2013.01); *H01L 29/66431* (2013.01); *H01L 29/737* (2013.01); *H01L 29/778* (2013.01)

(58) Field of Classification Search
CPC ............. H01L 29/2003; H01L 29/66462; H01L 29/778; H01L 29/66431; H01L 29/737; H01L 21/76877; H01L 21/76897; H01L 21/76898; H01L 23/481; H01L 23/49827
USPC .......... 257/183, 192, 194, 200, 201, E29.246, 257/E29.252, E21.403, E21.407
See application file for complete search history.

(56) References Cited

U.S. PATENT DOCUMENTS

| 5,225,707 A * | 7/1993 | Komaru et al. ............... 257/513 |
| 7,339,207 B2 * | 3/2008 | Murata et al. ................. 257/192 |

(Continued)

FOREIGN PATENT DOCUMENTS

| JP | 2012-038885 A | 2/2012 |
| KR | 2001-0102317 A | 11/2001 |

(Continued)

OTHER PUBLICATIONS

R. Reiner et al., "Simulation and Analysis of Low-Resistance AlGaN/GaN HFET Power Switches", Fraunhofer Institute for Applied Solid State Physics, Sep. 2011.

*Primary Examiner* — Eduardo A Rodela
(74) *Attorney, Agent, or Firm* — Rabin & Berdo, P.C.

(57) ABSTRACT

Provided is a nitride semiconductor device including: a substrate having through via holes; first and second nitride semiconductor layers sequentially stacked on the substrate; drain electrodes and source electrodes provided on the second nitride semiconductor layer; and an insulating pattern provided on the second nitride semiconductor layer, the insulating pattern having upper via holes provided on the drain electrodes, wherein the through via holes are extended into the first and second nitride semiconductor layers and expose a bottom of each of the source electrodes.

13 Claims, 7 Drawing Sheets

(51) Int. Cl.
  *H01L 29/49* (2006.01)
  *H01L 29/417* (2006.01)
  *H01L 29/778* (2006.01)
  *H01L 29/737* (2006.01)

(56) References Cited

U.S. PATENT DOCUMENTS

| | | | |
|---|---|---|---|
| 7,419,862 B2 | 9/2008 | Lim et al. | |
| 7,759,700 B2 * | 7/2010 | Ueno et al. | 257/192 |
| 8,466,566 B2 | 6/2013 | Nakanishi et al. | |
| 2006/0060895 A1 * | 3/2006 | Hikita et al. | 257/280 |
| 2006/0199322 A1 * | 9/2006 | Ogawa et al. | 438/197 |
| 2008/0079023 A1 * | 4/2008 | Hikita et al. | 257/192 |
| 2009/0057720 A1 * | 3/2009 | Kaneko | 257/194 |
| 2009/0146185 A1 * | 6/2009 | Suh et al. | 257/194 |
| 2013/0321082 A1 * | 12/2013 | Yamada | 330/277 |

FOREIGN PATENT DOCUMENTS

| | | |
|---|---|---|
| KR | 2007-0088307 A | 8/2007 |
| KR | 2012-0041237 A | 4/2012 |
| WO | WO-01/47008 A1 | 6/2001 |
| WO | WO-2006/089614 A1 | 8/2006 |
| WO | WO-2011/014951 A1 | 2/2011 |

* cited by examiner

NITRIDE SEMICONDUCTOR DEVICE

CROSS-REFERENCE TO RELATED APPLICATIONS

This U.S. non-provisional patent application claims priority under 35 U.S.C. §119 to Korean Patent Application No. 10-2013-0166513, filed on Dec. 30, 2013, the entire contents of which are hereby incorporated by reference.

BACKGROUND

The present invention disclosed herein relates to nitride semiconductor devices, and more particularly, to GaN semiconductor devices having a structure in which currents are vertically applied.

A GaN based compound semiconductor is a direct energy gap semiconductor, may control wavelengths from visible rays to ultraviolet rays, and has excellent properties such as high thermal and chemical stability, high electron mobility and a saturated electron velocity, and large energy bandgap compared to typical GaAs and InP based compound semiconductors. Based on such characteristics, the application of the GaN based compound semiconductor is being expanded to optical devices such as visible light-emitting diodes LEDs and laser diodes LDs, and electronic devices used for next-generation wireless communication and satellite systems requiring high output power and high frequency characteristics, in which the typical compound semiconductors have limit In particular, nitride semiconductors ($Al_xIn_yGa_{1-x-y}N$) containing aluminum (Al) are next-generation nitride semiconductor materials that have a high energy bandgap characteristic of 3.4 eV to 6.2 eV, may be manufactured as light-emitting devices in all ultraviolet ranges, and may be manufactured as electronic devices by 2D electron gases (2-DEG) when forming heterojunction structures with GaN such as AlGaN/GaN and InAlN/GaN structures.

The semiconductor devices may be classified into two types: vertical devices in which currents flow perpendicularly to a substrate, and lateral devices in which the currents flow horizontally to the substrate. Examples of the vertical devices, such as a vertical diffused MOS (VDMOS) and an insulated gate bipolar mode transistor (IGBT) are easy to deal with high currents because bulk currents flow. The vertical devices are frequently used for power semiconductors due to such advantages but they have a limitation in that a manufacturing process is complicated. On the contrary, the lateral devices have a limitation in that it is difficult to deal with high currents because currents laterally flow only on the surface of a channel layer, but the manufacturing process is relatively simple. Most of the currently manufactured CMOSs and GaAs or GaN based semiconductor devices are lateral devices.

Since the GaN material has a large energy bandgap and high electron mobility compared to competitors such as Si, GaAs and SiC materials, it is appropriate for applying to power semiconductor devices. Furthermore, the GaN material shows excellent characteristics in power density, backward breakdown field, and electron mobility and is recently encroaching on the main market of a power semiconductor technology, IGBT. However, due to the intrinsic limit of the lateral device that is difficult to deal with high currents, there is a big difficulty in commercializing the GaN power semiconductor.

SUMMARY

The present invention provides a nitride semiconductor device in which an on-resistance characteristic has been improved.

Embodiments of the present invention provide nitride semiconductor devices including a substrate having through via holes; first and second nitride semiconductor layers sequentially stacked on the substrate; drain electrodes and source electrodes provided on the second nitride semiconductor layer; and an insulating pattern provided on the second nitride semiconductor layer, the insulating pattern having upper via holes provided on the drain electrodes, wherein the through via holes are extended into the first and second nitride semiconductor layers and expose a bottom of each of the source electrodes.

In some embodiments, the nitride semiconductor devices may further include gate electrodes provided on the second nitride semiconductor layer, wherein the gate electrodes comprise a plurality of column electrodes extended in a first direction, and a plurality of row electrodes extended in a second direction that crosses the first direction.

In other embodiments, the second nitride semiconductor layer may have recess regions, and the gate electrodes may be provided in the recess regions.

In still other embodiments, the drain and source electrodes may be disposed between the plurality of column electrodes and between the plurality of row electrodes, and the drain and source electrodes may be alternately and repetitively arranged.

In even other embodiments, from a planar view, the upper via holes may be aligned with the drain electrodes.

In yet other embodiments, from a planar view, the through via holes may be aligned with the source electrodes.

In further embodiments, the nitride semiconductor devices may further include gate electrodes provided on the second nitride semiconductor layer, wherein the gate electrodes may have a line shape extended in a first direction and be spaced apart from one another in a second direction that crosses the first direction.

In still further embodiments, the second nitride semiconductor layer may have recess regions, and the gate electrodes may be provided in the recess regions.

In even further embodiments, the drain and source electrodes may have a line shape extended in the first direction and be alternately and repetitively arranged between the gate electrodes.

In yet further embodiments, from a planar view, the upper via holes may have a line shape extended along the drain electrodes.

In much further embodiments, from a planar view, the through via holes may be aligned with the source electrodes and spaced apart from one another in the first direction.

In still much further embodiments, the nitride semiconductor devices may further include a drain electrode pad covering a top surface of the insulating pattern, the drain electrode pad being extended along an internal sidewall of each of the upper via holes to be in contact with the drain electrodes; and a source electrode pad covering a bottom surface of the substrate, the source electrode pad being extended along an internal sidewall of each of the through via holes to be in contact with the source electrodes.

In even much further embodiments, the first nitride semiconductor layer and the second nitride semiconductor layer may form a heterojunction structure.

In yet much further embodiments, the drain and source electrodes may form an ohmic contact to the second nitride semiconductor layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
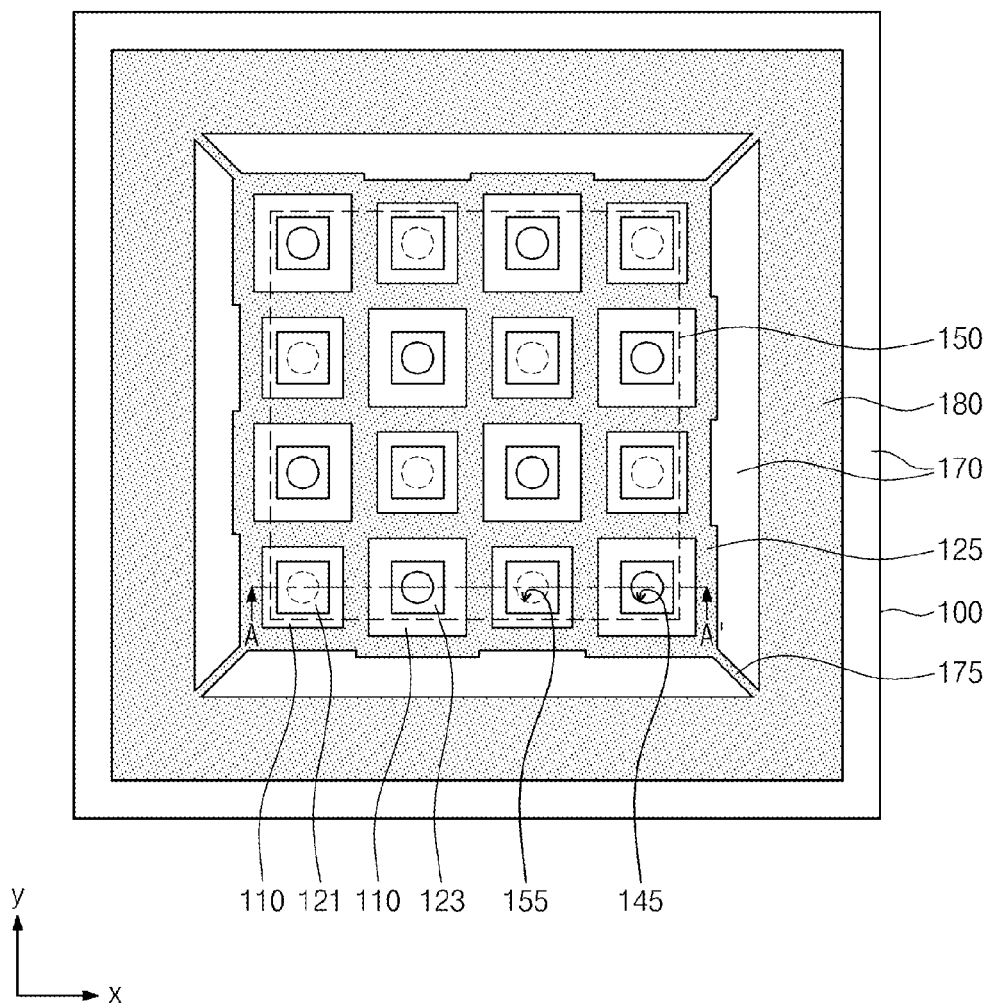
FIG. 1 is a plane view for explaining a nitride semiconductor device according to an embodiment of the present invention.

The above objectives, other objectives, characteristics and advantages of the present invention will be easily understood through the following embodiments to be described with reference to the accompanying drawings. However, the present invention is not limited embodiments to be described below but may be implemented in other forms. Rather, these embodiments are provided so that this disclosure will be thorough and complete, and will fully convey the scope of the present invention to a person skilled in the art.

In the specification, when a film (or layer) is referred to as being 'on' another film (or layer) or substrate, it can be directly on the other film (or layer) or substrate, or a third film (or layer) may also be present therebetween. Also, the size and thickness of components of the drawings are exaggerated for clarity. Though terms like a first, a second, and a third are used to describe various regions and films (or layers) in various embodiments of the present invention, the regions and the films are not limited to these terms. These terms are used only to distinguish a certain region or film (or layer) from another region or film (or layer). Therefore, a layer referred to as a first membrane in one embodiment can be referred to as a second membrane in another embodiment. Each embodiment described and illustrated herein includes its complementary embodiment. The term 'and/or' used in the specification is used as a meaning including at least one of components listed before and after the term. The same reference numerals represent the same components throughout the disclosure.

Various embodiments are described below in detail with reference to the accompanying drawings.

Figure 2:
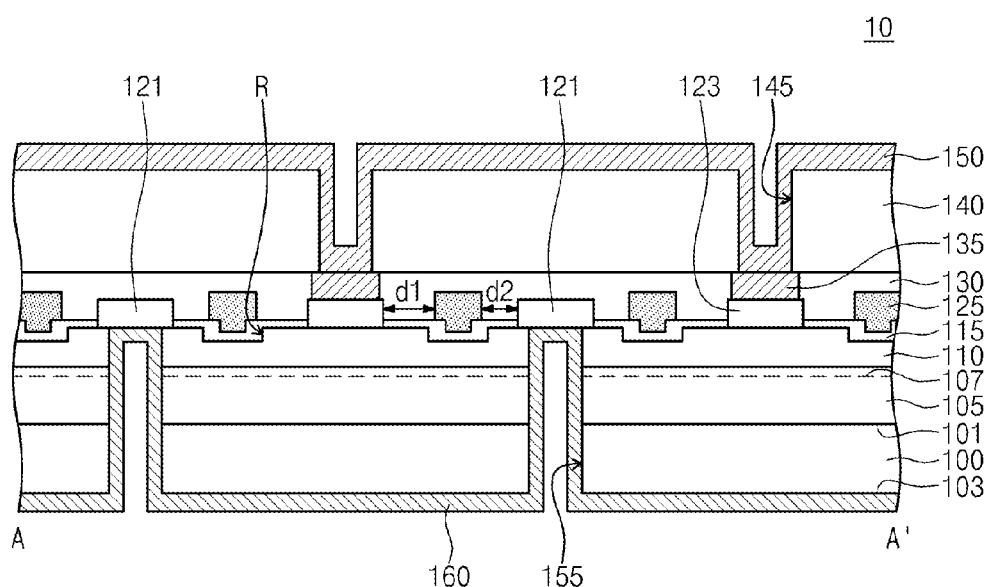
FIG. 2 is a cross-sectional view taken along line A-A' of FIG. 1, which explains a nitride semiconductor device according to an embodiment of the present invention.

FIG. 1 is a plane view for explaining a nitride semiconductor device according to an embodiment of the present invention. FIG. 2 is a cross-sectional view taken along line A-A' of FIG. 1, which explains a nitride semiconductor device according to an embodiment of the present invention.

Referring to FIGS. 1 to 2, a nitride semiconductor device 10 according to an embodiment of the present inventive concepts may include a substrate 100, and a first and a second nitride semiconductor layer 105 and 110 that are sequentially provided on the substrate 100. The substrate 100 has a top surface 101 on which the first and the second nitride semiconductor layers 105 and 110 are provided, and a bottom surface 103 that faces the top surface 101. The substrate 100 may be an insulative high-resistivity substrate. As an example, the substrate 100 may include sapphire ($Al_2O_3$), silicon (Si), gallium arsenic (GaAs), silicon carbide (SiC) or gallium nitride (GaN). Such a substrate 100 may have a thickness of 50 um to 400 um through a substrate thinning process.

The first nitride semiconductor layer 105 may include GaN, and the second nitride semiconductor layer 110 may include AlGaN, InAlN or InAlGaN. The first and the second nitride semiconductor layers 105 and 110 may be epitaxial layers. It is possible to include a buffer layer between the substrate 100 the first nitride semiconductor layer 105 or further include a stacked structure including a buffer layer and a relaxation layer, although not shown. The buffer layer may include GaN and the relaxation layer may include GaN or MN. The buffer layer may be provided to resolve limitations due to lattice mismatches between the substrate 100 and the nitride semiconductor layers, and the relaxation layer may be provided to relax the stress between the nitride semiconductor layers. Since the first nitride semiconductor layer 105 and the second nitride semiconductor layer 110 form a heterojunction structure such as a AlGaN/GaN, InAlN/GaN or InAlGaN/GaN structure, a 2D electron gas (2-DEG) layer 107 may be formed on the interface therebetween.

The second nitride semiconductor layer 110 may have recess regions Rs that are formed by removing the top of the second nitride semiconductor layer 110. According to an embodiment, the upper and lower parts of the recess regions R may have substantially the same widths. That is, the second nitride semiconductor layer 110 exposed by the recess regions R may have a vertical sidewall. In another embodiment, the recess regions R may become tapered. That is, the second nitride semiconductor layer 110 exposed by the recess regions R may have an inclined sidewall. From a planar view, the recess regions R may have a grid form. That is, the recess regions R may form a plurality of columns extended in a first direction (y direction) and a plurality of rows extended in a second direction (x direction) that crosses the first direction.

Gate electrodes 125 may be provided in the recess regions R. The gate electrodes 125 may form the same alignment as the recess regions R. That is, from a planar view, the gate electrodes 125 may have a grid form in which they are aligned with the recess regions R. Thus, the gate electrodes 125 may include a plurality of column electrodes extended in the y direction and a plurality of row electrodes extended in the x direction. The gate electrodes 125 may include at least one of aluminum (Al), molybdenum (Mo), gold (Au), nickel (Ni), platinum (Pt), titanium (Ti), palladium (Pd), iridium (Ir), rhodium (Rh), cobalt (Co), tungsten (W), tantalum (Ta), copper (Cu), and zinc (Zn). The gate electrodes 125 may include palladium (Pd). The nitride semiconductor device using, as a channel, the 2-DEG 107 due to the heterojunction structure of the nitride semiconductor layers may fundamentally have a normally-on characteristic. However, since the present inventive concepts provides the gate electrodes 125 in the recess regions R, a threshold voltage increases in a positive (+) direction and thus it is possible to implement the nitride semiconductor device 10 having a normally-off characteristic.

Source and drain electrodes 121 and 123 may be provided on the second nitride semiconductor layer 110 between the gate electrodes 125. The source and drain electrodes 121 and 123 may be alone arranged in the space between the gate electrodes 125 to be 2-dimensionally aligned. That is, the source and drain electrodes 121 and 123 may be alternately and repetitively arranged between the gate electrodes 125 to form a plurality of rows and columns The drain electrodes 123 may be spaced apart by a first distance d1 from neighboring gate electrodes 125 and the source electrodes 121 may be spaced apart by a second distance d2 from neighboring gate electrodes 125. In general, a gate-drain breakdown voltage Vgd may be determined depending on the space between the gate electrode and the drain electrode. Since the nitride semiconductor device 10 according to an embodiment of the present inventive concepts needs a high gate-drain breakdown voltage Vgd, it may be arranged so that the space between the gate electrode 125 and the drain electrode 123 is sufficiently secured. Thus, the space between the gate electrode 125 and the drain electrode 123 may be larger than that between the gate electrode 125 and the source electrode 121. That is, the first distance d1 may be larger than the second distance d2. From a planar view, the shapes of the cross sections of the source and drain electrodes 121 and 123 may be quadrilateral but is not limited thereto.

The source and drain electrodes 121 and 123 may include at least one of aluminum (Al), molybdenum (Mo), gold (Au), nickel (Ni), platinum (Pt), titanium (Ti), palladium (Pd), iridium (Ir), rhodium (Rh), cobalt (Co), tungsten (W), tantalum (Ta), copper (Cu), and zinc (Zn). The source and drain electrodes 121 and 123 may include a stacked structure such as a Ti/Au/Ni/Au structure. The source and drain electrodes 121 and 123 may make an ohmic contact with the second nitride semiconductor layer 110 through a thermal treatment process. In the present embodiment, the gate electrodes, the source electrodes, and the drain electrodes provided on the nitride semiconductor layer on which the 2-DEG 117 is formed may configure a high electron mobility transistor (HEMT).

A gate insulating layer 115 may be provided between the gate electrodes 125 and the second nitride semiconductor layer 110. The gate insulating layer 115 partially fills the recess regions R and is extended onto the second nitride semiconductor layer 110 to be able to be in contact with sidewalls of the source and drain electrodes 121 and 123. The gate insulating layer 115 may include an oxide or a nitride.

A protective layer 130 and metal patterns 135 that pass through the protective layer 130 and are in contact with the drain electrodes 123 may be provided on the second nitride semiconductor layer 110. The protective layer 130 may cover the gate electrodes 125, the source electrodes 121, and the drain electrodes 123. The protective layer 130 may include an oxide or a nitride. The metal patterns 135 may include a metal material and in particular, at least one of Ti, Ni, Au, Pt, Cu and Al.

An interlayer insulating pattern 140 having upper via holes 145 that expose the metal patterns 135 may be provided on the protective layer 130. The interlayer insulating pattern 140 may include an oxide or a nitride and may be formed of the same material as the protective layer 130. In the present embodiment, the upper via holes 145 may be of the shape of a hollow pillar that is opened toward the top of the interlayer insulating pattern 140 and exposes the metal patterns 135. The upper via holes 145 may have the same planar alignment as the drain electrodes 123. The interlayer insulating pattern 140 may be provided with a sufficient thickness to be able to withstand a breakdown voltage higher than the gate-drain breakdown voltage Vgd. As an example, the thickness of the interlayer insulating pattern 140 may be equal to or thicker than 2 um. In an embodiment, the protective layer 130 and the metal patterns 135 may be omitted. In such a case, the interlayer insulating pattern 140 may cover the gate electrodes 125, the source electrodes 121, and the drain electrodes 123, and the upper via holes 145 may expose the drain electrodes 123.

A drain electrode pad 150 that covers the top of the interlayer insulating pattern 140 and is extended to the internal sidewall of each of the upper via holes 145 may be provided on the interlayer insulating pattern 140. The drain electrode pad 150 may cover the top of each of the metal patterns 135 exposed by the upper via holes 145. The drain electrode pad 150 may not completely fill the upper via holes 145. In another embodiment, the drain electrode pad 150 may completely fill the upper via holes 145 and cover the interlayer insulating pattern 140, although not shown. The drain electrode pad 150 may include the same material as the metal patterns 135.

Through via holes 155 that pass through the substrate 100 may be provide in the substrate 100. The through via holes 155 may be extended to the first and second nitride semiconductor layers 105 and 110 and expose the bottom of each of the source electrodes 121. In an embodiment, the through via holes 155 may be of the shape of a hollow pillar that is opened toward the bottom surface 103 of the substrate 100 and exposes the bottom of each of the source electrodes 121. The through via holes 155 may have the same alignment as the source electrodes 121.

A source electrode pad 160 may be provided on the bottom 103 of the substrate 100. The source electrode pad 160 may be extended to the internal sidewall of each of the internal sidewall of each of the through via holes 155 while covering the bottom surface 103 of the substrate 100 and are in contact with the source electrodes 121. In an embodiment, the source electrode pad 160 may not completely fill the through via holes 155. The source electrode pads 160 may include a metal material and in particular, at least one of Ti, Ni, Au, Pt, Cu and Al.

Continuing to refer to FIG. 1, device separation regions 170 and a gate pad region 180 may be provided onto the substrate 100. The device separation regions 170 may be ones that are formed by removing the 2-DEG 107 in order to provide a plurality of nitride semiconductor devices 10 onto the substrate 100. The gate pad region 180 may be electrically connected to the gate electrodes 125 through a gate connecting line 175. The gate pad region 180 and the gate connecting line 175 may be formed by using the same material and method as the gate electrodes 125.

According to an embodiment of the present inventive concepts, since the source and drain electrode pads connected to the source and drain electrodes are respectively provided onto the top and bottom of the substrate, the area occupied by the source and drain electrodes on the same plane may relatively increase and the area of metal pads to which currents are supplied may also increase. Thus, an on-resistance increase due to an electrode may be improved. Also, since the source and drain electrodes are alternately and repetitively arranged in the space between the gate electrodes to have a layout forming a plurality of rows and columns, currents per electrode may flow in four directions and thus it is possible to lower on-resistance per area. Thus, the nitride semiconductor device having an enhanced electrical characteristic may be provided.

FIGS. 3 to 9 are cross-sectional views taken along line A-A' of FIG. 1, which explain a nitride semiconductor device according to an embodiment of the present inventive concepts.

Figure 3:
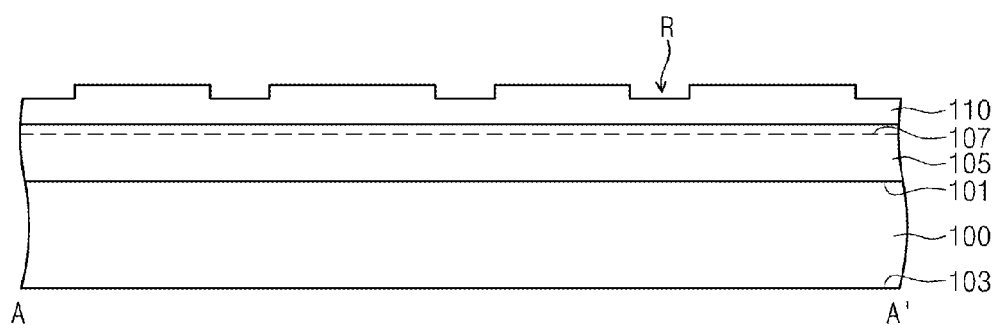
FIGS. 3 to 9 are cross-sectional views taken along line A-A' of FIG. 1, which explain a nitride semiconductor device according to an embodiment of the present invention.

Referring to FIGS. 1 and 3, the first and the second nitride semiconductor layers 105 and 110 may be sequentially formed on the substrate 100. The substrate 100 has the top 101 on which nitride semiconductor layers are formed, and the bottom surface 103 that faces the top surface 101. The substrate 100 may be an insulative high-resistivity substrate. As an example, the substrate 100 may include sapphire ($Al_2O_3$), silicon (Si), gallium arsenic (GaAs), silicon carbide (SiC) or gallium nitride (GaN).

The first nitride semiconductor layer 105 may include GaN, and the second nitride semiconductor layer 110 may include AlGaN, InAlN or InAlGaN. The first and the second nitride semiconductor layers 105 and 110 may be formed by an epitaxial growth process. The epitaxial growth process for forming the first and the second nitride semiconductor layers 105 and 110 may include at least one of metal organic chemical vapor deposition, liquid phase epitaxy, hydride liquid phase epitaxy, molecular beam epitaxy and metal organic vapor phase epitaxy (MOVPE). It is possible to include a buffer layer between the substrate 100 the first nitride semiconductor layer 105 or further include a stacked structure including a buffer layer and a relaxation layer, although not shown. The buffer layer may include GaN and the relaxation layer may include GaN or MN. Since the first nitride semiconductor layer 105 and the second nitride semiconductor layer 110 form a heterojunction structure such as an AlGaN/GaN, InAlN/GaN or InAlGaN/GaN structure, the 2-DEG layer 107 may be formed on the interface therebetween.

The second nitride semiconductor layer 110 may have recess regions R that are formed by removing the top of the second nitride semiconductor layer 110. The recess regions R may be formed by forming a mask pattern (not shown) on the second nitride semiconductor layer 110 and performing an etching process in which the mask pattern is used as an etching mask. According to an embodiment, the upper and lower parts of the recess regions R may have substantially the same widths. That is, the second nitride semiconductor layer 110 exposed by the recess regions R may have a vertical sidewall. In another embodiment, the recess regions R may become tapered. That is, the second nitride semiconductor layer 110 exposed by the recess regions R may have an inclined sidewall. From a planar view, the recess regions R may have a grid form.

Figure 4:
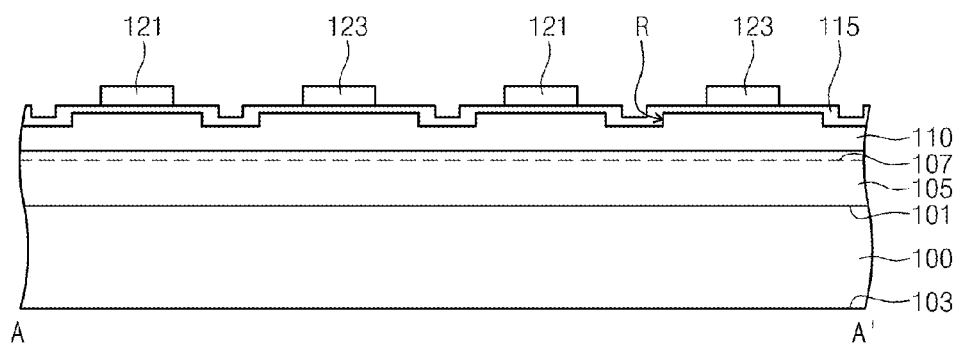

That is, the recess regions R may include a plurality of columns extended in a first direction (y direction) and a plurality of rows extended in a second direction (x direction) that crosses the first direction. Referring to FIGS. 1 and 4, the gate insulating layer 115 may be formed on the second nitride semiconductor layer 110 on which the recess regions R are formed. The gate insulating layer 115 may be formed on the entire surface of the second nitride semiconductor layer 110 along the profile thereof on which the recess regions R are formed. The gate insulating layer 115 may not completely fill the recess regions R. The gate insulating layer 115 may include an oxide or a nitride, and may be formed by a chemical vapor deposition (CVD) process.

Then, the source electrodes 121 and the drain electrodes 123 may be formed on the second nitride semiconductor layer 110. Specifically, the source and the drain electrodes 121 and 123 may be formed by etching the gate insulting layer 115 to expose the second nitride semiconductor layer 110, depositing a metal material on the exposed second nitride semiconductor layer 110, and then pattering the deposited metal material. The source and drain electrodes 121 and 123 may include at least one of aluminum (Al), molybdenum (Mo), gold (Au), nickel (Ni), platinum (Pt), titanium (Ti), palladium (Pd), iridium (Ir), rhodium (Rh), cobalt (Co), tungsten (W), tantalum (Ta), copper (Cu), and zinc (Zn). In particular, the source and drain electrodes 121 and 123 may include a stacked structure such as a Ti/Au/Ni/Au structure. The source and drain electrodes 121 and 123 may make an ohmic contact with the second nitride semiconductor layer 110 through a thermal treatment process.

From a planar view, the source and drain electrodes 121 and 123 may be alternately and repetitively arranged alone in the space between the recess regions R to be 2-dimensionally aligned. That is, the source and drain electrodes 121 and 123 may be alternately and repetitively arranged between the recess regions R to form a plurality of rows and columns From a planar view, the shape of each of the source and drain electrodes 121 and 123 may be quadrilateral but is not limited thereto.

Figure 5:
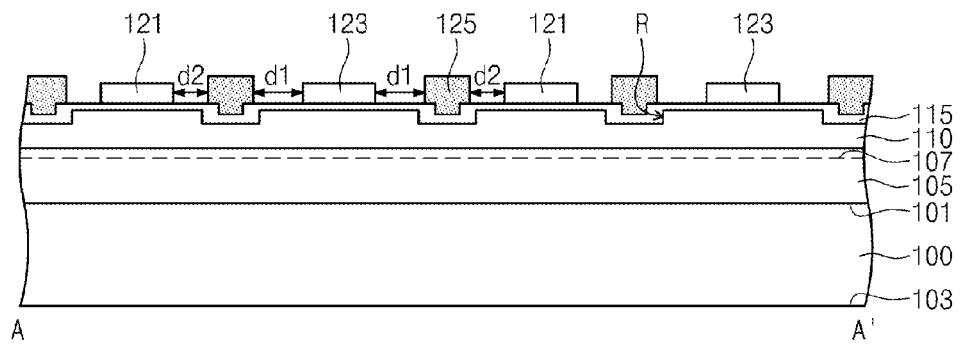

Referring to FIGS. 1 and 5, the gate electrodes 125 may be formed on the gate insulating layer 115. In particular, the gate electrodes 125 may be formed to surround the source and drain electrodes 121 and 123 while filling the recess regions R on which the gate insulating layer 115 is formed. That is, from a planar view, the gate electrodes 125 between the source and drain electrodes 121 and 123 may have a grid form in which they are aligned with the recess regions R. The gate electrodes 125 may be spaced apart by the first distance d1 from neighboring drain electrodes 123 and be spaced apart by the second distance d2 from neighboring source electrodes 121. The first distance d1 may be larger than the second distance d2. The gate electrodes 125 may include at least one of aluminum (Al), molybdenum (Mo), gold (Au), nickel (Ni), platinum (Pt), titanium (Ti), palladium (Pd), iridium (Ir), rhodium (Rh), cobalt (Co), tungsten (W), tantalum (Ta), copper (Cu), and zinc (Zn).

In particular, the gate electrodes 125 may include palladium (Pd).

Figure 6:
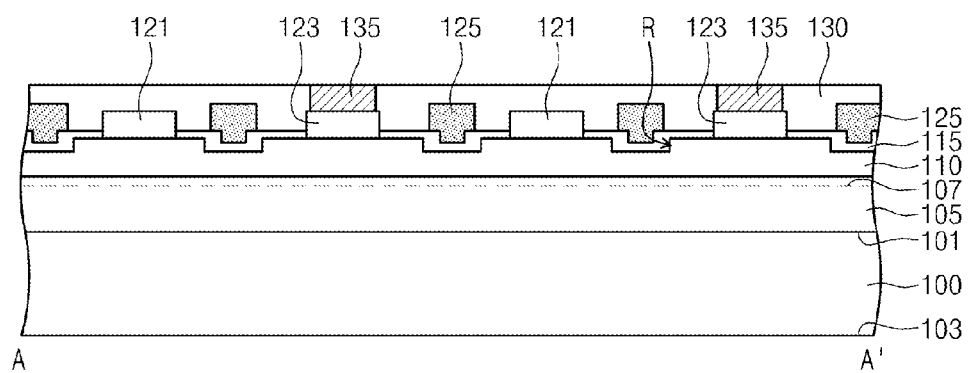

Referring to FIGS. 1 and 6, the protective layer 130 that covers the gate electrodes 125, the source electrodes 121, and the drain electrodes 123 may be formed on the product of FIG. 5. The protective layer 130 may include an oxide or a nitride, and may be formed by a chemical vapor deposition (CVD) process. Then, the metal patterns 135 that pass through the protective layer 130 and are in contact with the drain electrodes 123 may be formed. The metal patterns 135 may include a metal material and in particular, at least one of Ti, Ni, Au, Pt, Cu and Al. The metal patterns 135 may be formed by a physical vapor deposition process or an electroplating process.

Figure 7:
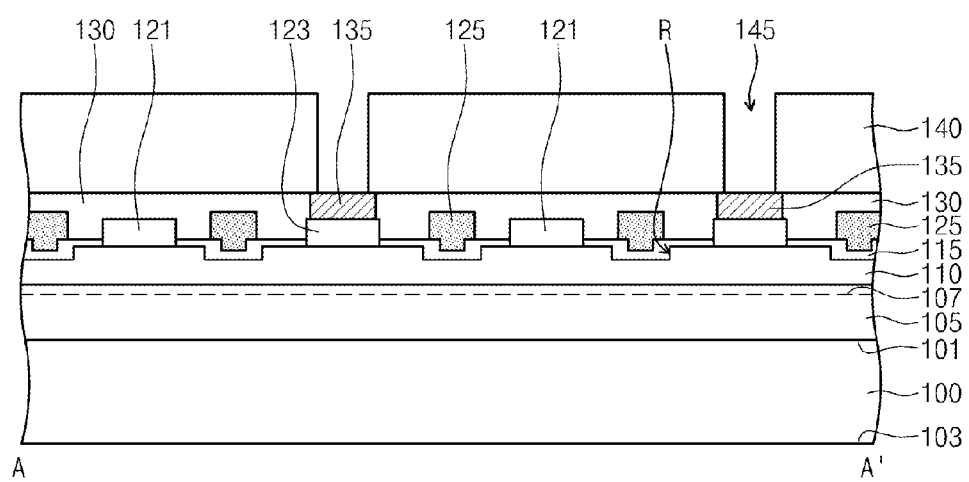

Referring to FIGS. 1 and 7, the interlayer insulating pattern 140 having the upper via holes 145 that expose the metal patterns 135 may be formed on the product of FIG. 6. Specifically, the interlayer insulating pattern 140 may be formed by forming the interlayer insulating layer on the protective layer 130 and performing a pattering process for the formation of the upper via holes 145. The pattering process may include forming a mask pattern (not shown) on the interlayer insulating layer and performing an anisotropic etching process by using the mask pattern as an etching mask. The interlayer insulating pattern 140 may include an oxide or a nitride and may be formed of the same material as the protective layer 130. In an embodiment, the upper via holes 145 may be formed in the shape of a hollow pillar that is opened toward the top of the interlayer insulating pattern 140 and exposes the metal patterns 135. In an embodiment, the protective layer 130 and the metal patterns 135 may be omitted. In such a case, the interlayer insulating pattern 140 may cover the gate electrodes 125 and the source and drain electrodes 121 and 123, and the upper via holes 145 may expose the drain electrodes 123.

Figure 8:
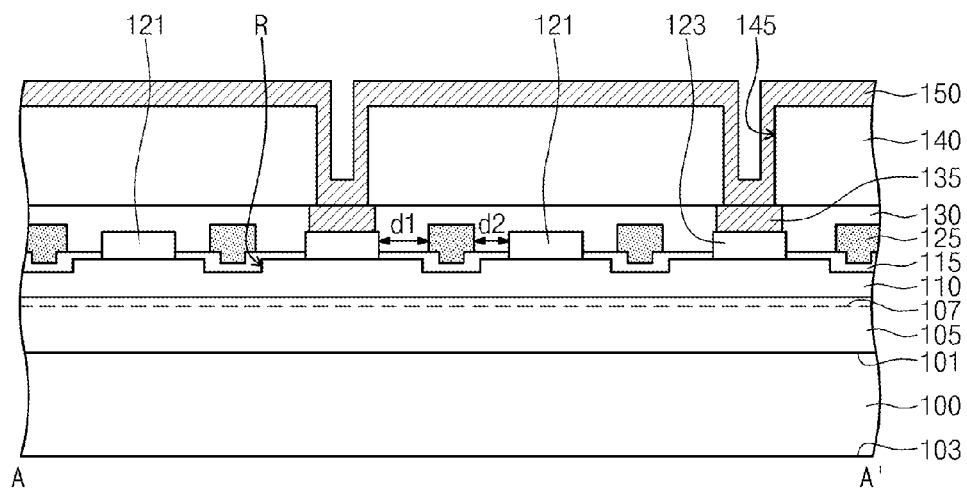

FIGS. 1 and 8, the drain electrode pad 150 that covers the top of the interlayer insulating pattern 140 and is extended to the internal sidewall of each of the upper via holes 145 may be formed. The drain electrode pad 150 may cover the tops of the metal patterns 135 exposed by the upper via holes 145. The drain electrode pad 150 may not completely fill the upper via holes 145. In another embodiment, the drain electrode pad 150 may completely fill the upper via holes 145 and cover the interlayer insulating pattern 140, although not shown. The drain electrode pad 150 may be formed by using the same material and method as the metal patterns 135.

Figure 9:
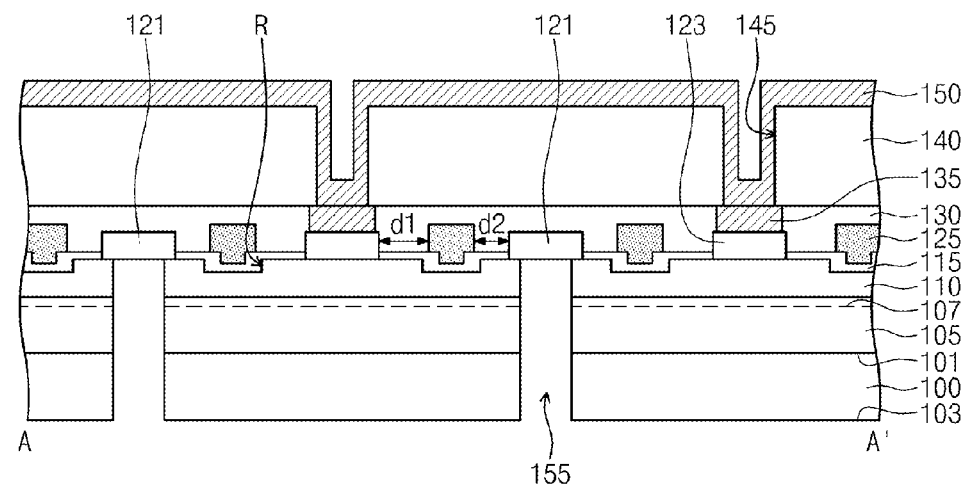

Referring to FIGS. 1 and 9, the through via holes 155 may be formed which pass through the substrate 100 and the first and the second nitride semiconductor layers 105 and 110 and expose the bottom of each the source electrodes 121. Specifically, the through via holes 155 may be formed by performing a two-step etching process in which the first nitride semiconductor layer 105 and the substrate 100 are first etched by using etchant having etch selectivity and then the first and the second nitride semiconductor layers 105 and 110 are etched. The etching process may include a dry and/or wet etching process. In an embodiment, the through via holes 155 may be formed in the shape of a hollow pillar that is opened toward the bottom surface 103 of the substrate 100 and exposes the bottom of each of the source electrodes 121. In an embodiment, before forming the through via holes 155, a substrate thinning process may be performed in which the bottom surface 103 of the substrate 100 is recessed. The substrate thinning process may include at least one of an etching process using etchant or slurry in which a material (e.g., silicon) forming the substrate 100 may be selectively removed, a chemical-mechanical polishing process and a grinding process.

Referring back to FIG. 2, the source electrode pad 160 may be formed which covers the recessed bottom of the substrate 100 and is extended to the internal sidewall of each of the through via holes. The source electrode pad 160 may cover the bottom of each of the source electrodes 121 exposed by the through via holes 155. The source electrode pad 160 may not completely fill the through via holes 155. The source electrode pads 160 may include a metal material and in particular, at least one of Ti, Ni, Au, Pt, Cu and Al. The source electrode pads 160 may be formed by a physical vapor deposition process or an electroplating process.

Figure 10:
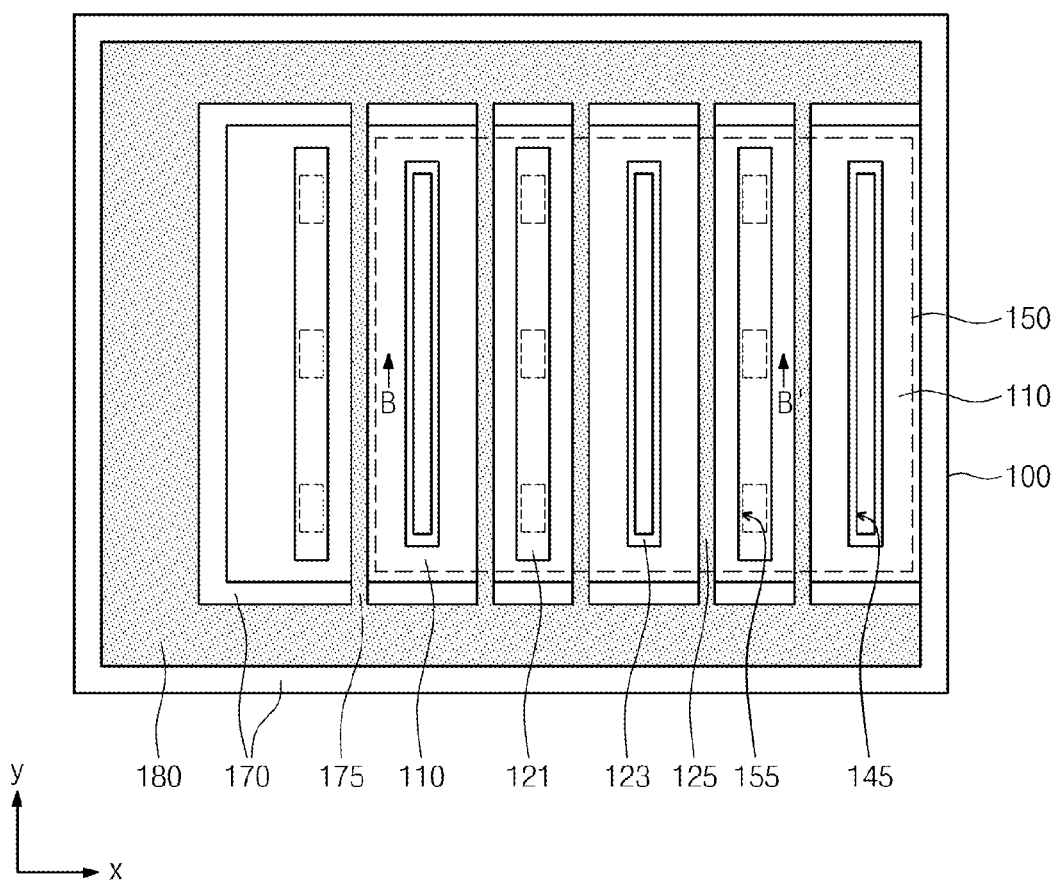
FIG. 10 is a cross-sectional view taken along line B-B' of FIG. 10, which explains a nitride semiconductor device according to an embodiment of the present invention.
Figure 11:
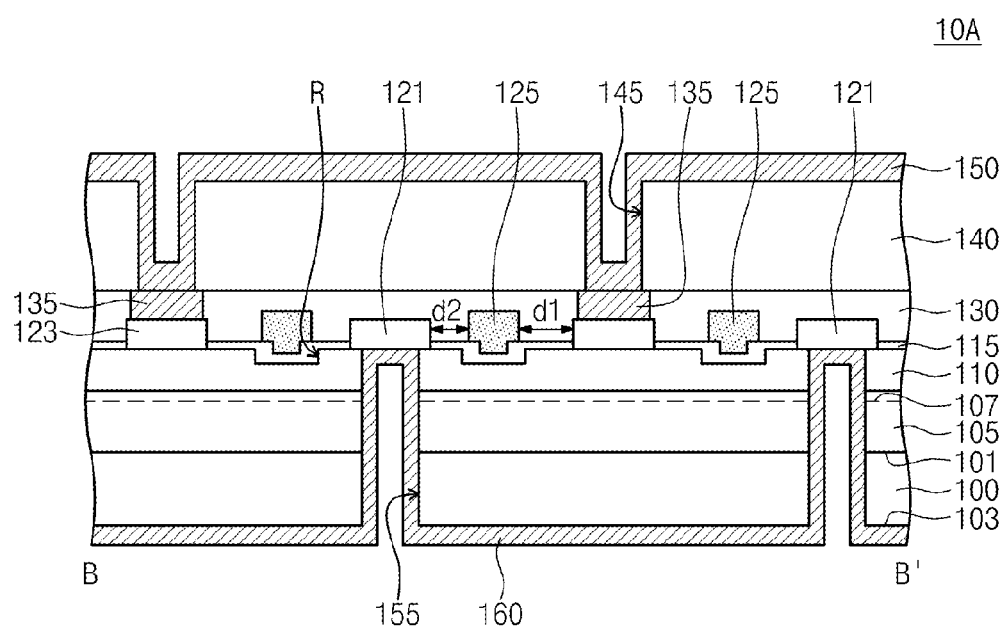
FIG. 11 is a cross-sectional view taken along line B-B' of FIG. 10, which explains a nitride semiconductor device according to another embodiment of the present invention.

FIG. 10 is a plane view for explaining a nitride semiconductor device according to another embodiment of the present inventive concepts. FIG. 11 is a cross-sectional view taken along line B-B' of FIG. 10, which explains a nitride semiconductor device according to another embodiment of the present inventive concepts.

A nitride semiconductor device 10A of FIGS. 10 and 11 may have substantially the same configuration as the nitride semiconductor device 10 of FIGS. 1 and 2 except for the shapes and/or alignments of electrodes and electrode pads. That is, the nitride semiconductor device 10A of FIGS. 10 and 11 may be formed by using the same material and method as the nitride semiconductor device 10 of FIGS. 1 and 2.

Referring to FIGS. 10 and 11, the first and the second nitride semiconductor layers 105 and 110 may be sequentially formed on the substrate 100. Since the nitride semiconductor layers 105 and 110 form a heterojunction structure such as an AlGaN/GaN, InAlN/GaN or InAlGaN/GaN structure, the 2-DEG layer 107 may be formed on the interface therebetween.

The gate electrodes 125, the source electrodes 121 and the drain electrodes 123 may be provided on the nitride semiconductor layers 105 and 110 on which the 2-DEG layer 107 is formed. The gate electrodes 125 may be provided in the recess regions R of the second nitride semiconductor layer 110. The gate electrodes 125 may have a line shape extended in the y direction and be spaced apart from one another in the x direction. The source electrodes 121 and the drain electrodes 123 may be alternately and repetitively arranged between the gate electrodes 125. The source and drain electrodes 121 and 123 may have a line shape extended in the y direction. The drain electrodes 123 may be spaced apart from the gate electrodes 125 by the first distance d1. The source electrodes 121 may be spaced apart from the gate electrodes 125 by the second distance d2.

The gate insulating layer 115 may be provided between the gate electrodes 125 and the second nitride semiconductor layer 110. The gate insulating layer 115 partially fills the recess regions R and is extended onto the second nitride semiconductor layer 110 to be able to be in contact with sidewalls of the source and drain electrodes 121 and 123.

The protective layer 130 and the metal patterns 135 that pass through the protective layer 130 and are in contact with the drain electrodes 123 may be provided on the second nitride semiconductor layer 110. The metal patterns 135 may have substantially the same cross-sectional shape as the drain electrodes 123. The metal patterns 135 may have a line shape extended in the y direction.

The interlayer insulating pattern 140 having the upper via holes 145 that expose the metal patterns 135 may be provided on the protective layer 130. The upper via holes 145 may be of the shape of a hollow pillar that is opened toward the top of the interlayer insulating pattern 140 and exposes the metal patterns 135. The upper via holes 145 may be extended in the y direction. The drain electrode pad 150 that covers the top of the interlay insulating pattern 140 and is extended to the internal sidewall of each of the upper via holes 145 may be provided on the interlayer insulating pattern 140. The drain electrode pad 150 may cover the top of each of the metal patterns 135 exposed by the upper via holes 145.

The through via holes 155 that pass through the substrate 100 may be provide in the substrate 100. The through via holes 155 may be extended to the first and second nitride semiconductor layers 105 and 110 and expose the bottom of each of the source electrodes 121. The through via holes 155 may be of the shape of a hollow pillar that is opened toward the bottom surface 103 of the substrate 100 and exposes the bottom of each of the source electrodes 121. From a planar view, the through via holes 155 may be respectively aligned with the source electrodes 121 and be spaced apart from one another in the y direction. The source electrode pad 160 may be provided on the bottom surface 103 of the substrate 100. The source electrode pad 160 may be extended to the internal sidewall of each of the through via holes 155 while covering the bottom surface 103 of the substrate 100 and may be in contact with the source electrodes 121.

Continuing to refer to FIG. 10, the device separation regions 170 and the gate pad region 180 may be provided onto the substrate 100. The device separation regions 170 may be ones that are formed by removing the 2-DEG 107 in order to provide a plurality of nitride semiconductor devices 10A onto the substrate 100. The gate pad region 180 may be electrically connected to the gate electrodes 125 through the gate connecting line 175.

According to an embodiment of the present inventive concepts, since the electrode pads connected to the source and drain electrodes are respectively provided onto the top and bottom of the substrate, the area occupied by the source and drain electrodes on the same plane may relatively increase and the area of metal pads to which currents are supplied may also increase. Thus, the on-resistance increase due to the electrode may be improved. Also, since the source and drain electrodes are alternately and repetitively arranged in the space between the gate electrodes to have a layout forming a plurality of rows and columns, currents per electrode may flow in four directions and thus it is possible to lower on-resistance per area. Thus, the nitride semiconductor device having an enhanced electrical characteristic may be provided.

Exemplary embodiments of the present inventive concepts have been discussed so far. It will be understood by a person skilled in the art that various changes in form and details may be made therein without departing from the spirit and scope of the inventive concepts. Therefore, the disclosed embodiments should be considered in a descriptive sense only and not for purposes of limitation. The scope of the inventive concepts is defined not by the detailed description of the inventive concepts but by the appended claims, and all differences within the scope will be construed as being included in the present inventive concepts.

What is claimed is:

1. A nitride semiconductor device comprising:
a substrate having through via holes;
first and second nitride semiconductor layers sequentially stacked on the substrate;
drain electrodes and source electrodes provided on the second nitride semiconductor layer;
gate electrodes provided on the second nitride semiconductor layer; and
an insulating pattern provided on the second nitride semiconductor layer, the insulating pattern having upper via holes provided on the drain electrodes,
wherein the through via holes are extended into the first and second nitride semiconductor layers and expose a bottom of each of the source electrodes, and
wherein the gate electrodes comprise a plurality of column electrodes extended in a first direction, and a plurality of row electrodes extended in a second direction that crosses the first direction.

2. The nitride semiconductor device of claim 1, wherein the second nitride semiconductor layer has recess regions, and
the gate electrodes are provided in the recess regions.

3. The nitride semiconductor device of claim 1, wherein the drain and source electrodes are disposed between the plurality of column electrodes and between the plurality of row electrodes, and
wherein from a planar view, the drain and source electrodes are alternately and repetitively arranged.

4. The nitride semiconductor device of claim 3, wherein from a planar view, the upper via holes are aligned with the drain electrodes.

5. The nitride semiconductor device of claim 3, wherein from a planar view, the through via holes are aligned with the source electrodes.

6. The nitride semiconductor device of claim 1, further comprising:
a drain electrode pad covering a top surface of the insulating pattern, the drain electrode pad being extended along an internal sidewall of each of the upper via holes to be in contact with the drain electrodes; and
a source electrode pad covering a bottom surface of the substrate, the source electrode pad being extended along an internal sidewall of each of the through via holes to be in contact with the source electrodes.

7. The nitride semiconductor device of claim 1, wherein the first nitride semiconductor layer and the second nitride semiconductor layer form a heterojunction structure.

8. The nitride semiconductor device of claim 1, wherein the drain and source electrodes form an ohmic contact to the second nitride semiconductor layer.

9. A nitride semiconductor device comprising:
a substrate having through via holes;
first and second nitride semiconductor layers sequentially stacked on the substrate;
drain electrodes and source electrodes provided on the second nitride semiconductor layer;
gate electrodes provided on the second nitride semiconductor layer; and
an insulating pattern provided on the second nitride semiconductor layer, the insulating pattern having upper via holes provided on the drain electrodes,
wherein the through via holes are extended into the first and second nitride semiconductor layers and expose a bottom of each of the source electrodes,
wherein the gate electrodes have a line shape extended in a first direction and are spaced apart from one another in a second direction that crosses the first direction, and
wherein the gate electrodes are electrically connected with one another.

10. The nitride semiconductor device of claim 9, wherein the second nitride semiconductor layer has recess regions, and
the gate electrodes are provided in the recess regions.

11. The nitride semiconductor device of claim 9, wherein the drain and source electrodes have a line shape extended in the first direction and are alternately and repetitively arranged between the gate electrodes.

12. The nitride semiconductor device of claim 11, wherein from a planar view, the upper via holes have a line shape extended along the drain electrodes.

13. The nitride semiconductor device of claim 11, wherein from a planar view, the through via holes are aligned with the source electrodes and spaced apart from one another in the first direction.

* * * * *